(12) United States Patent
Chang

(10) Patent No.: US 12,082,355 B2
(45) Date of Patent: Sep. 3, 2024

(54) FLIP COVER DEVICE AND HINGE THEREOF

(71) Applicant: AVISION INC., Hsinchu (TW)

(72) Inventor: Min-Hao Chang, Taipei (TW)

(73) Assignee: AVISION INC., Hsinchu (TW)

( * ) Notice: Subject to any disclaimer, the term of this patent is extended or adjusted under 35 U.S.C. 154(b) by 353 days.

(21) Appl. No.: 17/395,420

(22) Filed: Aug. 5, 2021

(65) Prior Publication Data

US 2022/0070319 A1 Mar. 3, 2022

(30) Foreign Application Priority Data

Sep. 1, 2020 (TW) .................................. 109129912

(51) Int. Cl.
*F16C 11/12* (2006.01)
*H05K 5/02* (2006.01)
*H05K 5/03* (2006.01)

(52) U.S. Cl.
CPC ............ *H05K 5/0217* (2013.01); *F16C 11/12* (2013.01); *H05K 5/0226* (2013.01); *H05K 5/03* (2013.01)

(58) Field of Classification Search
CPC ...... H05K 5/0217; H05K 5/0226; H05K 5/03; F16C 11/12
See application file for complete search history.

(56) References Cited

U.S. PATENT DOCUMENTS

| | | | |
|---|---|---|---|
| 5,979,016 A * | 11/1999 | Fan ........................ | E05D 7/1077 16/386 |
| 2009/0169288 A1* | 7/2009 | Tanaka ..................... | B42F 13/22 402/75 |
| 2021/0247016 A1* | 8/2021 | Affentranger ...... | F16M 11/2014 |

FOREIGN PATENT DOCUMENTS

| JP | 2017-155837 | 9/2017 |
|---|---|---|
| TW | 499125 | 8/2002 |
| TW | I663867 B | 6/2019 |

* cited by examiner

*Primary Examiner* — David H Banh
(74) *Attorney, Agent, or Firm* — Winston Hsu

(57) ABSTRACT

A flip cover device is provided and includes a cover, a main body and a hinge. The hinge is disposed on the main body and pivotally connected to the cover in a detachable manner for allowing the cover to pivotally unfold relative to the main body. The hinge includes a hinge body and a notch structure formed on the hinge body. The cover abuts against the main body when the cover pivotally unfolds relative to the main body to an unfolded position along a first pivoting direction. When the cover is located at the unfolded position and forced by a torque along the first pivoting direction, the cover is driven by a reaction force provided by the main body to disengage from the hinge, which prevents a damage of the cover caused by an improper and excessive pivotal movement of the cover. Besides, a related hinge is further provided.

4 Claims, 9 Drawing Sheets

FLIP COVER DEVICE AND HINGE THEREOF

BACKGROUND OF THE DISCLOSURE

1. Field of the Disclosure

The present invention relates to a flip cover device and a hinge thereof, and more specifically, to a flip cover device which can prevent a cover from being damaged or broken, and a hinge thereof.

2. Description of the Prior Art

A flip cover device, such as a scanner or a multi-function apparatus, usually includes a main body and a cover pivotally connected to the main body and capable of folding or unfolding relative to the main body, so that the flip cover device can switch between an unfolded state and a folded state. The cover of the conventional flip cover device can be configured to interfere with the main body to position the cover at a predetermined angle when the cover is pivotally unfolded at the predetermined angle relative to the main body. However, if the cover which interferes with the main body is forced by an unfolding force along an unfolding direction, an excessive stress may lead to a permanent structural damage of the cover. In other words, the cover of the conventional flip cover device may be damaged or broken easily due to an improper and excessive pivotal movement of the cover.

SUMMARY OF THE DISCLOSURE

Therefore, it is an objective of the present invention to provide a flip cover device which can prevent a cover from being damaged or broken, and a hinge thereof for solving the aforementioned problem.

In order to achieve the aforementioned objective, the present invention discloses a flip cover device. The flip cover device includes a cover, a main body and at least one hinge. The at least one hinge is disposed on the main body. The at least one hinge is pivotally connected to the cover in a detachable manner for allowing the cover to pivotally unfold or fold relative to the main body. The at least one hinge includes a hinge body and a notch structure. The notch structure is formed on the hinge body. The cover abuts against the main body when the cover pivotally unfolds relative to the main body to an unfolded position along a first pivoting direction, and the cover is driven by a reaction force provided by the main body to disengage from the at least one hinge via the notch structure when the cover is located at the unfolded position and forced by a torque along the first pivoting direction.

According to an embodiment of the present invention, the hinge body includes a mounting portion and a pivoting portion connected to the mounting portion. The mounting portion is mounted on the main body. The notch structure is formed on the pivoting portion, and the cover includes at least one pivotal structure pivotally passing through the pivoting portion of the hinge body.

According to an embodiment of the present invention, a resilient abutting portion is formed on an end portion of the at least one pivotal structure. The resilient abutting portion is resiliently deformed during a process that the at least one pivotal structure pivotally passes through the pivoting portion of the hinge body, and the resilient abutting portion resiliently recovers to abut against the pivoting portion after the at least one pivotal structure pivotally passes through the pivoting portion of the hinge body.

According to an embodiment of the present invention, at least one recess and at least one mounting slot are formed on the main body. The at least one mounting slot is located at a position corresponding to the at least one recess. The mounting portion is mounted inside the at least one mounting slot, and the pivoting portion is at least partially exposed through the at least one recess.

According to an embodiment of the present invention, the main body includes a top wall and a lateral wall. The at least one recess is located at a connection of the top wall and the lateral wall. The mounting portion is inserted into the at least one mounting slot via the at least one recess along a mounting direction. The notch structure is formed on a lateral side of the pivoting portion, and the at least one pivotal structure is disengaged from the pivoting portion along a disengaging direction different from the mounting direction by the notch structure and the at least one recess.

In order to achieve the aforementioned objective, the present invention further discloses a hinge. The hinge is disposed between a cover and a main body of a flip cover device. The hinge is disposed on the main body. The hinge is pivotally connected to the cover in a detachable manner for allowing the cover to pivotally unfold or fold relative to the main body. The cover abuts against the main body when the cover pivotally unfolds relative to the main body to an unfolded position along a first pivoting direction. The hinge includes a hinge body and a notch structure. The notch structure is formed on the hinge body. The cover is driven by a reaction force provided by the main body to disengage from the hinge via the notch structure when the cover is located at the unfolded position and forced by a torque along the first pivoting direction.

According to an embodiment of the present invention, the hinge body further includes a mounting portion and a pivoting portion connected to the mounting portion. The mounting portion is mounted on the main body. The notch structure is formed on the pivoting portion, and the pivoting portion is for allowing a pivotal structure of the cover to pivotally pass therethrough.

According to an embodiment of the present invention, the pivoting portion abuts against a resilient abutting portion formed on an end portion of the pivotal structure after the pivotal structure pivotally passes through the pivoting portion.

According to an embodiment of the present invention, the mounting portion is mounted inside a mounting slot formed on the main body, and the pivoting portion is at least partially exposed through a recess formed on the main body and located at a position corresponding to the mounting slot.

According to an embodiment of the present invention, the mounting portion is inserted into the mounting slot via the recess along a mounting direction, and the notch structure is formed on a lateral side of the pivoting portion for allowing the pivotal structure to be disengaged from the pivoting portion along a disengaging direction different from the mounting direction by the notch structure and the recess.

In summary, in the present invention, since the hinge and the cover are pivotally connected to each other in a detachable manner, the cover can be driven by a reaction force provided by the main body to disengage from the hinge via the notch structure when the cover abuts against the main body and is forced by the torque along the first pivoting direction, i.e., an unfolding direction. Therefore, the present invention can effectively prevent a permanent structural damage of the cover due to an excessive stress of the cover abutted by the main body. In other words, the flip cover device can effectively prevent the cover from being damaged or broken due to an improper and excessive pivotal movement of the cover. Furthermore, after the cover is disengaged from the hinge via the notch structure, the cover and the hinge still can be pivotally connected to each other again easily to recover the flip cover device. Therefore, the present invention has an easy recovery operation or an easy maintenance operation.

These and other objectives of the present disclosure will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure (s) being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, the term "connect" is intended to mean either an indirect or direct electrical/mechanical connection. Thus, if a first device is connected to a second device, that connection may be through a direct electrical/mechanical connection, or through an indirect electrical/mechanical connection via other devices and connections.

Figure 1:
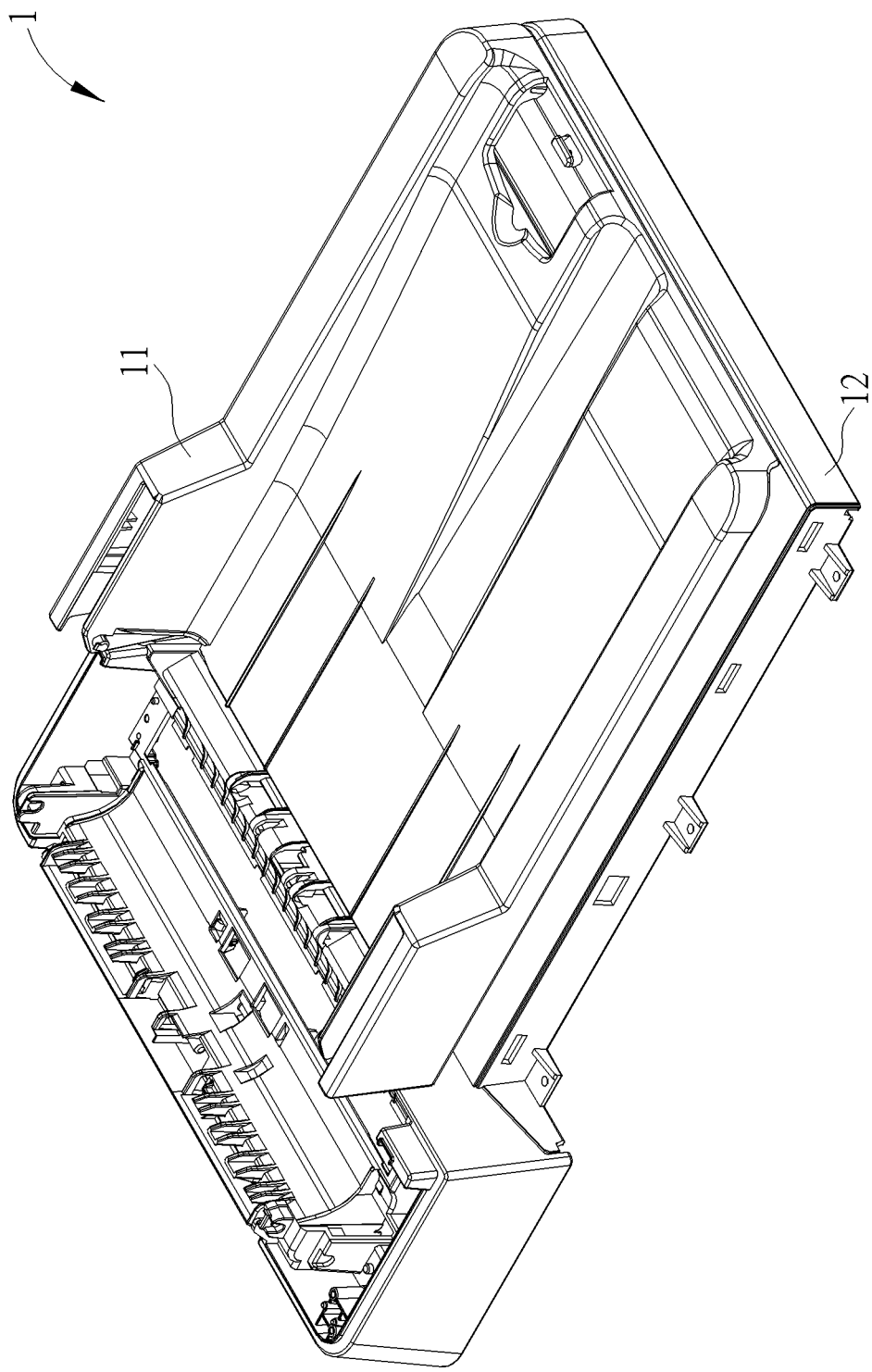
FIG. 1 to FIG. 3 are partial diagrams of a flip cover device at different views according to an embodiment of the present invention.
Figure 2:
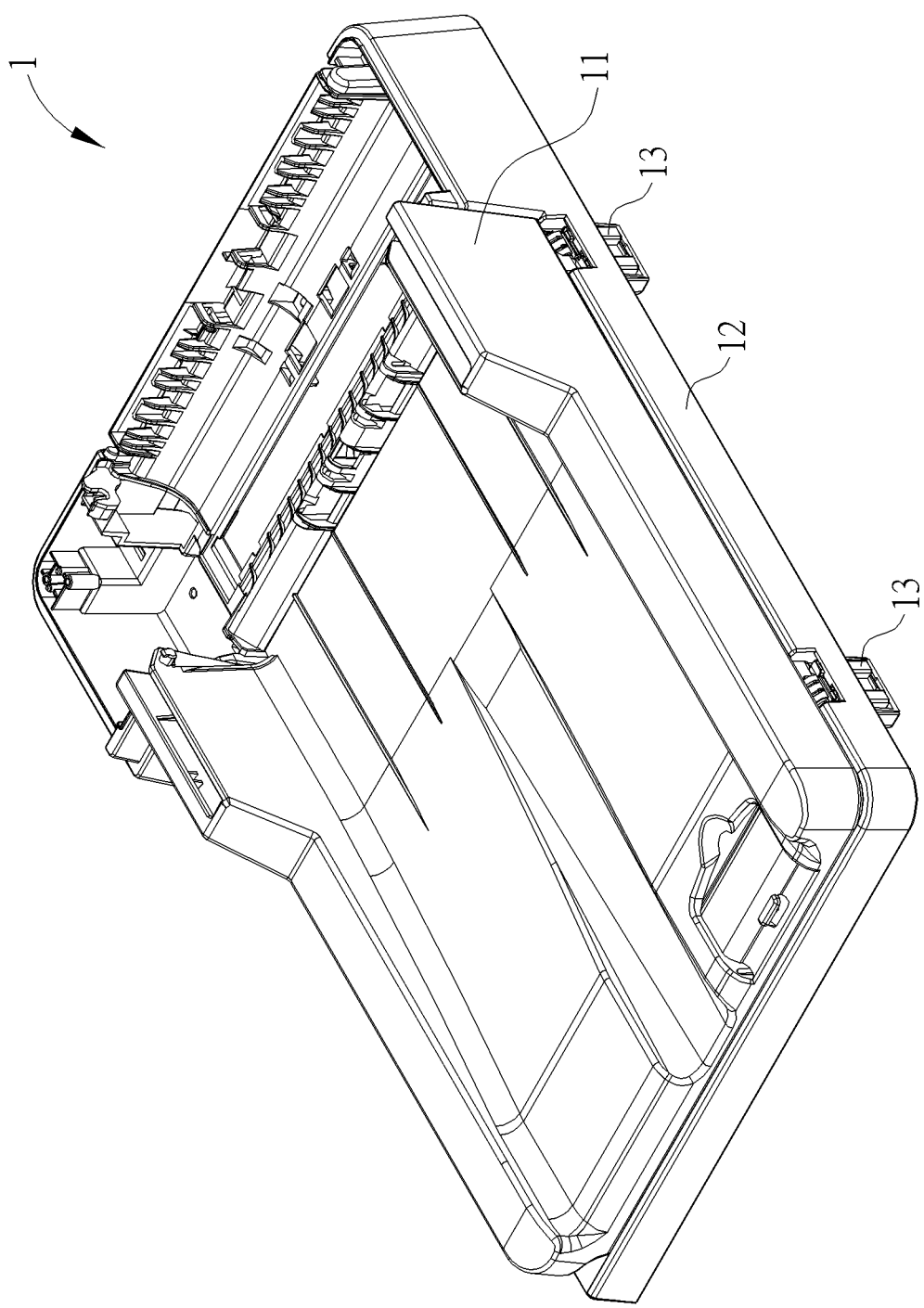
Figure 3:
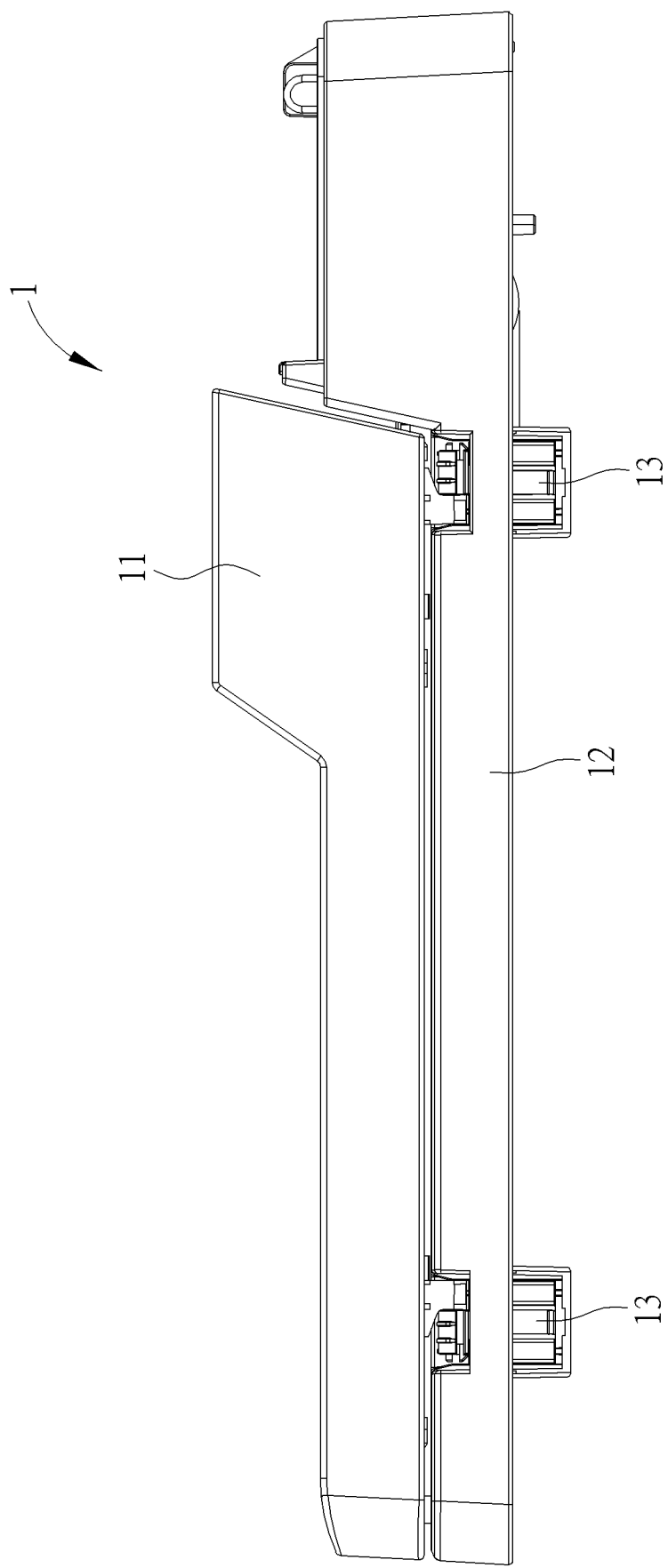
Figure 4:
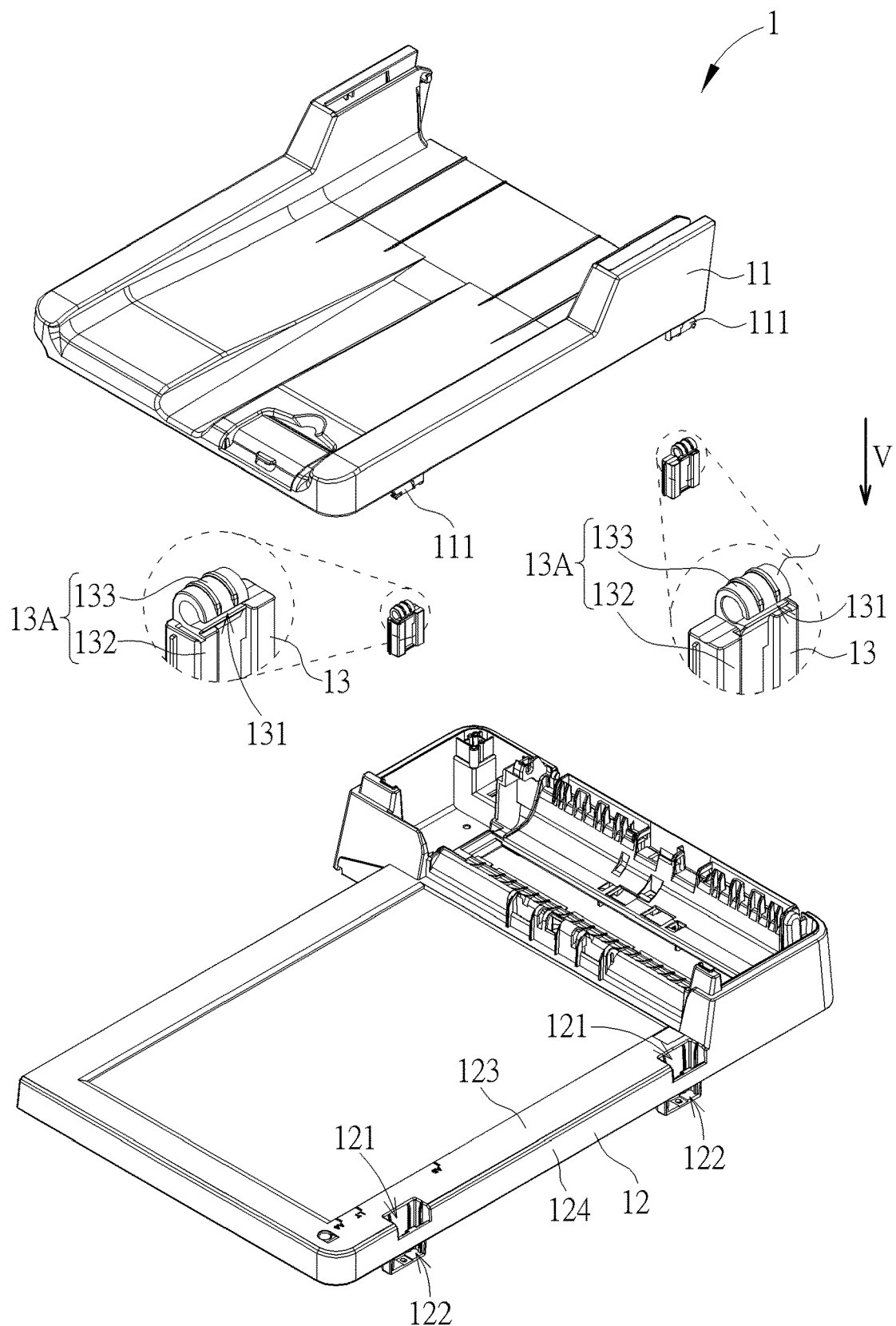
FIG. 4 is a partial exploded diagram of the flip cover device according to the embodiment of the present invention.

Please refer FIG. 1 to FIG. 4. FIG. 1 to FIG. 3 are partial diagrams of a flip cover device 1 at different views according to an embodiment of the present invention. FIG. 4 is a partial exploded diagram of the flip cover device 1 according to the embodiment of the present invention. As shown in FIG. 1 to FIG. 4, the flip cover device 1 includes a cover 11, a main body 12 and two hinges 13. The two hinges 13 are disposed on a same side of the main body 12 and spaced from each other. The cover 11 is pivotally connected to the hinges 13 in a detachable manner and capable of pivotally unfolding or folding relative to the main body 12. Each of the hinges 13 includes a hinge body 13A and a notch structure 131 formed on the hinge body 13A, so that the cover 11 can be driven by a reaction force provided by the main body 12 to disengage from the two hinges 13 via the two notch structures 131 when the cover 11 is forced by an external force or torque, for preventing a permanent structural damage of the cover 11 caused by an excessive stress of the cover 11 abutted by the main body 12. In this embodiment, the flip cover device 1 can be a multi-function apparatus. However, the present invention is not limited thereto.

Figure 5:
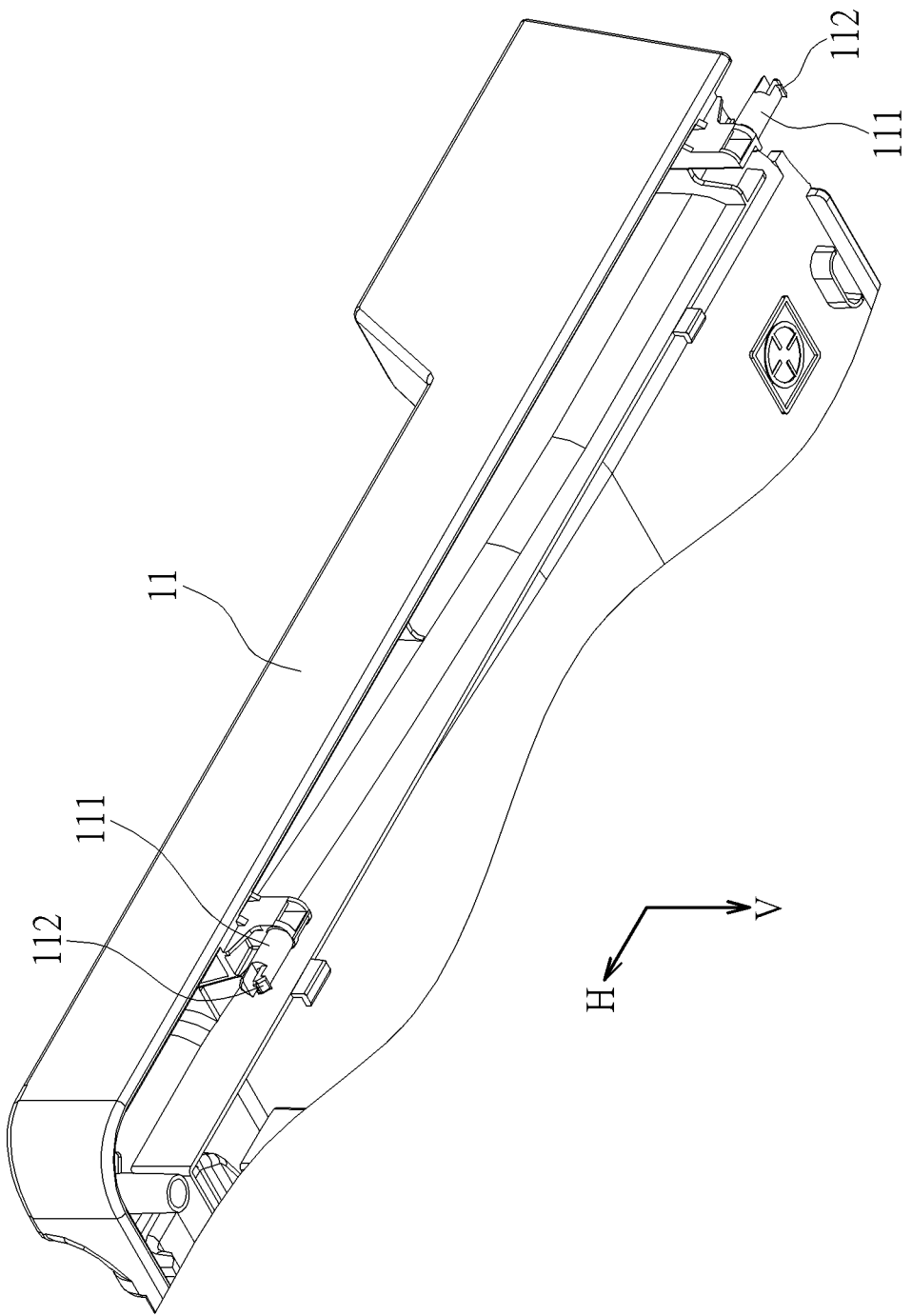
FIG. 5 is a partial structural diagram of a cover according to the embodiment of the present invention.
Figure 6:
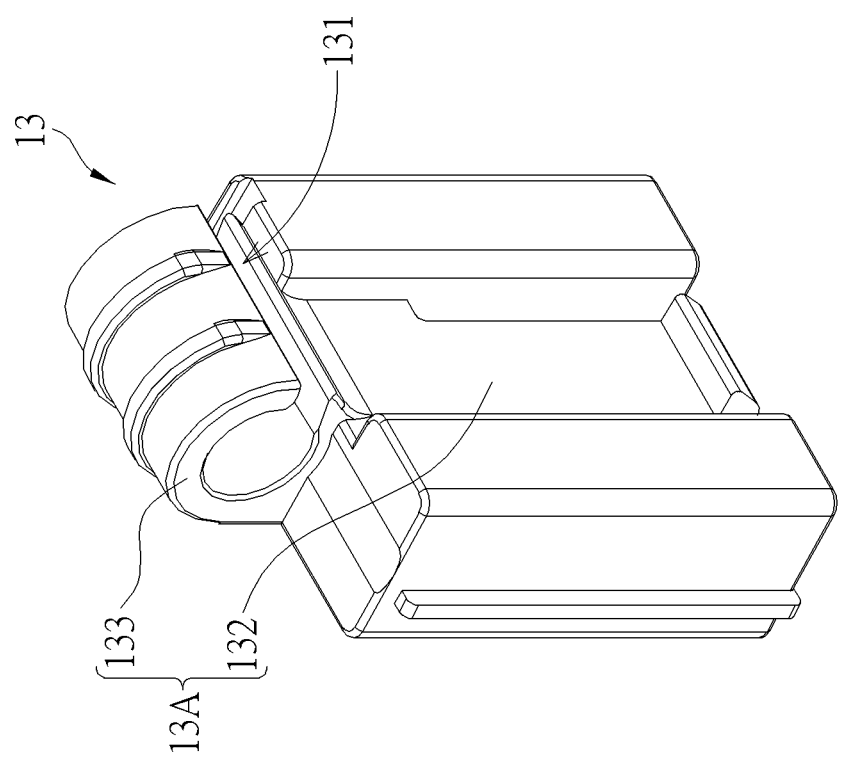
FIG. 6 is a diagram of hinges according to the embodiment of the present invention.
Figure 6:
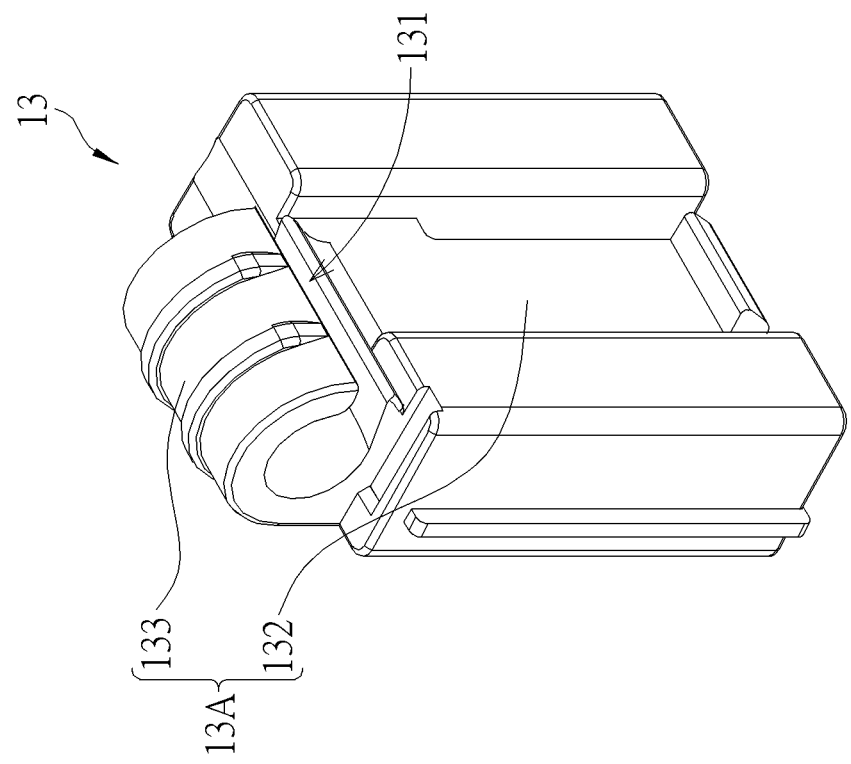
Figure 7:
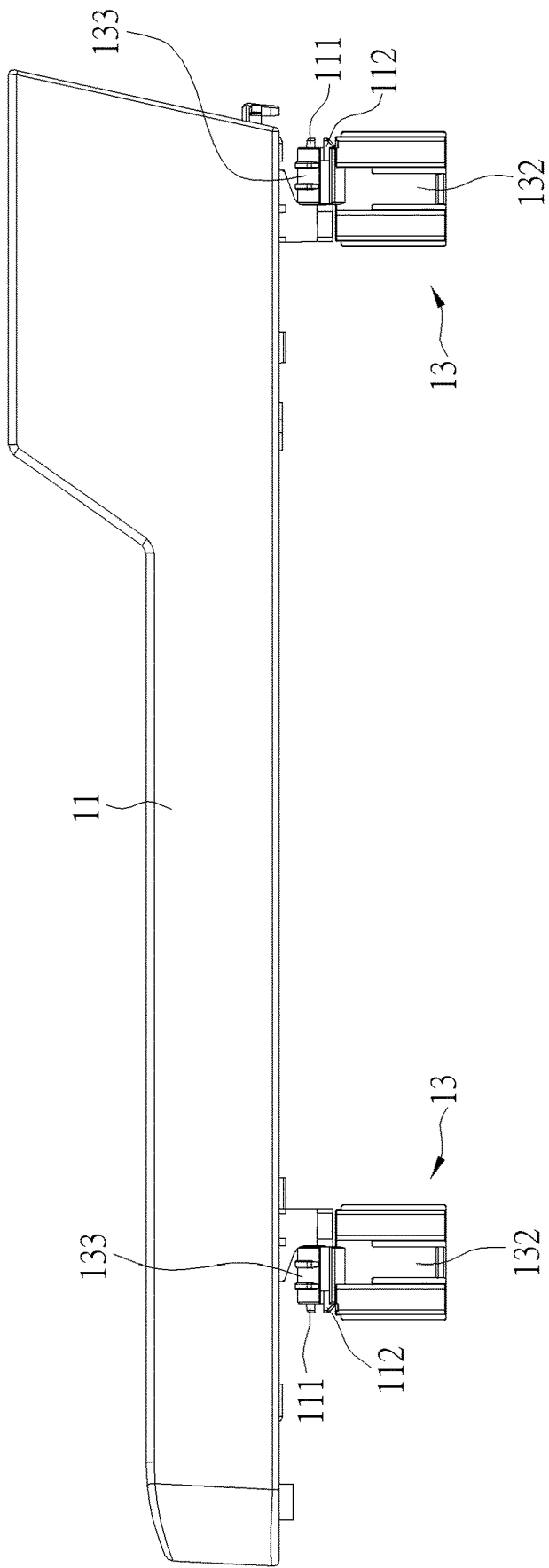
FIG. 7 is a diagram of the cover and the hinges pivotally connected to the cover according to the embodiment of the present invention.

Please refer to FIG. 4 to FIG. 7. FIG. 5 is a partial structural diagram of the cover 11 according to the embodiment of the present invention. FIG. 6 is a diagram of the hinges 13 according to the embodiment of the present invention. FIG. 7 is a diagram of the cover 11 and the hinges 13 pivotally connected to the cover 11 according to the embodiment of the present invention. As shown in FIG. 4 and FIG. 6, in this embodiment, each of the hinge bodies 13A includes a mounting portion 132 and a pivoting portion 133 connected to the mounting portion 132. Each of the mounting portions 132 is installed on the main body 12. Each of the pivoting portions 133 is pivotally connected to the cover 11. Each of the notch structures 131 is formed on the corresponding pivoting portion 133. More specifically, two recesses 121 and two mounting slots 122 are formed on the main body 12. The two mounting slots 122 are located at positions corresponding to the two recesses 121. Each of the mounting portions 132 is mounted inside the corresponding mounting slot 122. Each of the pivoting portions 133 is at least partially exposed through the corresponding recess 121. The cover 11 includes two pivotal structures 111. Each of the pivotal structures 111 pivotally passes through the corresponding pivoting portion 133.

Preferably, as shown in FIG. 4, each of the recesses 121 is located at a connection of a top wall 123 and a lateral wall 124 of the main body 12. Each of the mounting portions 132 passes through the corresponding recess 121 along a mounting direction parallel to a vertical direction V, so as to be mounted inside the corresponding mounting slot 122. Each of the notch structures 131 is formed on a lateral side of the corresponding pivoting portion 133, so that each of the pivotal structures 111 can be driven to disengage from the corresponding pivoting portion 133 along a disengaging direction different from the mounting direction via the corresponding notch structure 131 and the corresponding recess 121. The aforementioned configuration prevents the pivotal structures 11 from be interfered or obstructed to ensure the pivotal structures 11 to disengage from the hinges 13 successfully.

Besides, as shown in FIG. 5 and FIG. 7, a resilient abutting portion 112 is formed on an end portion of each of the pivotal structures 111. Each of the resilient abutting portions 112 can be resiliently deformed during a process that the corresponding pivotal structure 111 pivotally passes through the corresponding pivoting portion 133, and each of the resilient abutting portions 112 can resiliently recover to abut against the corresponding pivoting portion 133 after the corresponding pivotal structure 111 pivotally passes through the corresponding pivoting portion 133 for preventing each of the pivotal structures 111 from being disengaged from the corresponding pivoting portion 133 along a longitudinal direction parallel to a horizontal direction H, wherein the horizontal direction H is perpendicular to the vertical direction V.

However, the mounting direction, the disengaging direction and the longitudinal direction are not limited to this embodiment. It depends on practical demands. For example, in another embodiment, the mounting direction can be parallel to the horizontal direction, the longitudinal direction can be parallel to the vertical direction, and the disengaging direction can be different from the mounting direction.

Figure 8:
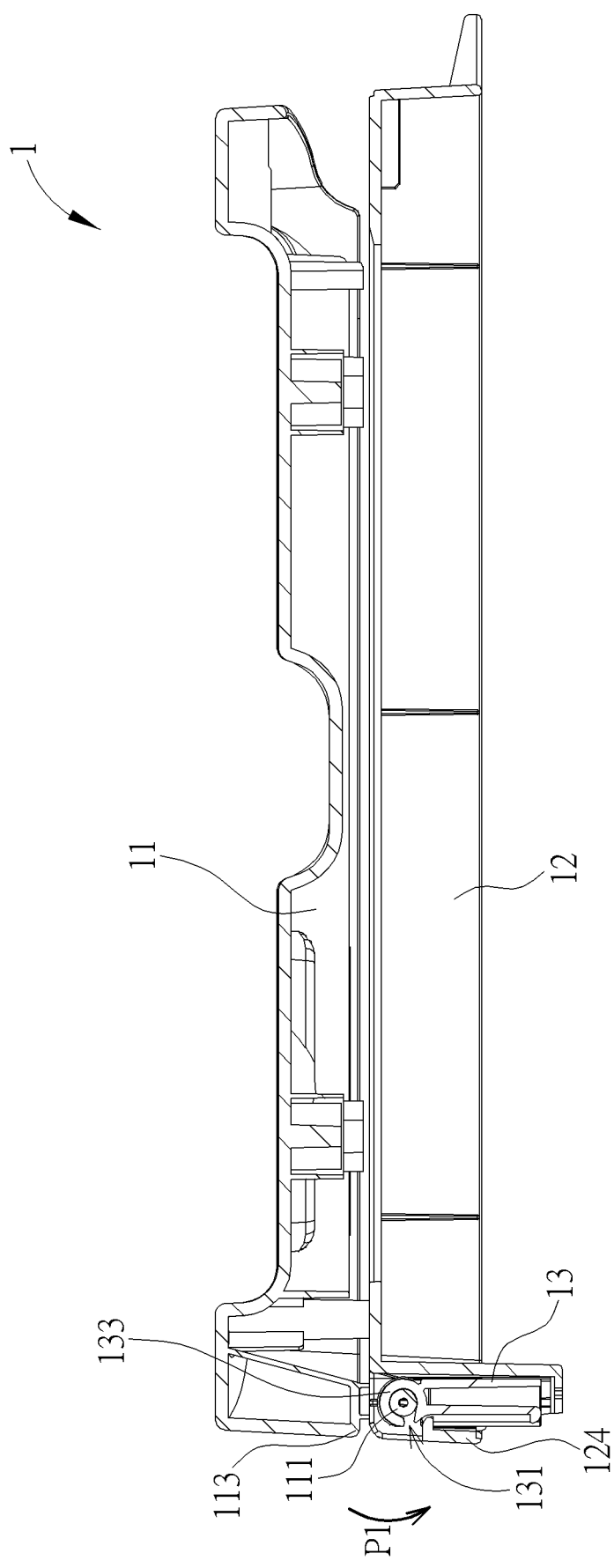
FIG. 8 and FIG. 9 are diagrams of the flip cover device according to the embodiment of the present invention.
Figure 9:
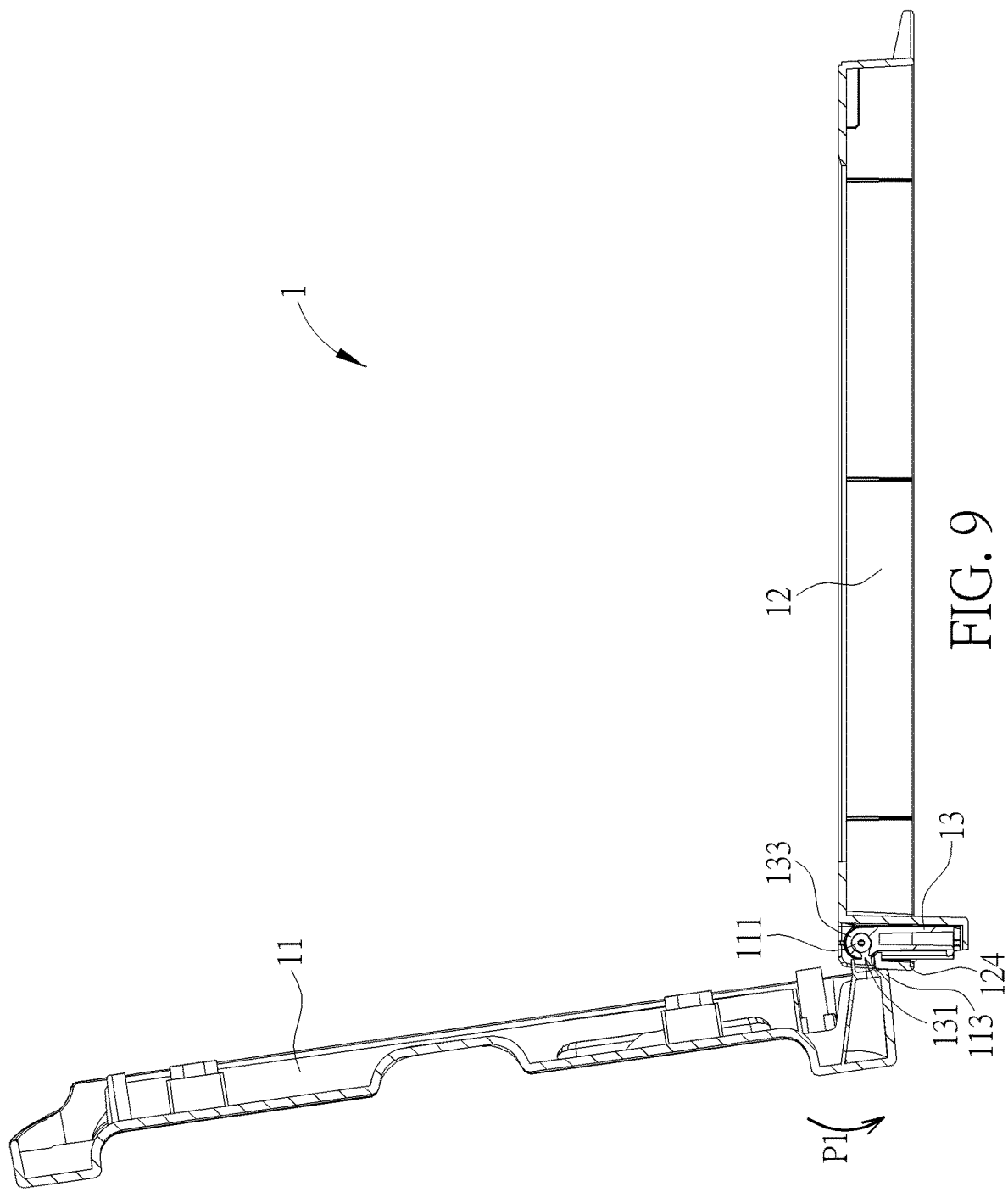

Operational principle of the present invention is described as follows. Please refer to FIG. 8 and FIG. 9. FIG. 8 and FIG. 9 are diagrams of the flip cover device 1 according to the embodiment of the present invention. When a user operates the cover 11 to drive the cover 11 to pivotally unfold relative to the main body 12 from a folded position as shown in FIG. 8 to an unfolded position as shown in FIG. 9 along a first pivoting direction P1 by the two hinges 13, e.g., when the cover 11 is moved to a position where an included angle between the cover 11 and the main body 12 is greater than 90 degrees, the cover 11 abuts against the main body 12 for positioning the cover 11 at the unfolded position. Specifically, as shown in FIG. 9, a corner 113 of the cover 11 adjacent to the pivotal structures 111 abuts against the lateral wall 124 of the main body 12. At this moment, the user can place a scanned object or a printed object on a platform of the main body 12 for scanning or printing. If the cover 11 which is located at the unfolded position as shown in FIG. 9 is still forced by the user, i.e., if the cover 11 which is located at the unfolded position receives a torque along the first pivoting direction P1, the cover 11 can be driven by the reaction force provided by the main body 12 to disengage from the pivoting portions 133 of the hinges via the notch structures 131 for preventing the permanent structural damage of the cover 11 due to an excessive stress of the cover 11 abutted by the main body 12.

It should be noticed that the numbers and the configurations of the hinge, the pivotal structure, the recess and the mounting slot are not limited to this embodiment. It depends on practical demands. For example, in another embodiment, the flip cover device can only include one hinge, one recess, one mounting slot disposed on a central portion of the main body and one pivotal structure disposed on a central portion of the lateral portion of the cover.

In contrast to the prior art, in the present invention, since the hinge and the cover are pivotally connected to each other in a detachable manner, the cover can be driven by a reaction force provided by the main body to disengage from the hinge via the notch structure when the cover abuts against the main body and is forced by the torque along the first pivoting direction, i.e., an unfolding direction. Therefore, the present invention can effectively prevent a permanent structural damage of the cover due to an excessive stress of the cover abutted by the main body. In other words, the flip cover device can effectively prevent the cover from being damaged or broken due to an improper and excessive pivotal movement of the cover. Furthermore, after the cover is disengaged from the hinge via the notch structure, the cover and the hinge still can be pivotally connected to each other again easily to recover the flip cover device. Therefore, the present invention has an easy recovery operation or an easy maintenance operation.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A flip cover device comprising:
   a cover comprising at least one pivotal structure;
   a main body; and
   at least one hinge disposed on the main body in an inserting manner, the at least one hinge being pivotally connected to the cover in a detachable manner for allowing the cover to pivotally unfold or fold relative to the main body, the at least one hinge being a one-piece structure, the at least one pivotal structure pivotally passing through the at least one hinge, the at least one hinge comprising:
   a hinge body; and
   a notch structure formed on the hinge body;
   wherein the cover abuts against the main body when the cover pivotally unfolds relative to the main body to an unfolded position along a first pivoting direction, and the cover is driven by a reaction force provided by the main body to disengage from the at least one hinge via the notch structure when the cover is located at the unfolded position and forced by a torque along the first pivoting direction;
   wherein the hinge body comprises a mounting portion and a pivoting portion connected to the mounting portion, the mounting portion is mounted on the main body, the notch structure is formed on the pivoting portion, and the at least one pivotal structure pivotally passes through the pivoting portion;
   wherein at least one recess and at least one mounting slot are formed on the main body, the at least one mounting slot is located at a position corresponding to the at least one recess, the mounting portion is mounted inside the at least one mounting slot, and the pivoting portion is at least partially exposed through the at least one recess;
   wherein the main body comprises a top wall and a lateral wall, the at least one recess is located at a connection of the top wall and the lateral wall, the mounting portion is inserted into the at least one mounting slot via the at least one recess along a mounting direction, the notch structure is formed on a lateral side of the pivoting portion, and the at least one pivotal structure is disengaged from the pivoting portion along a disengaging direction different from the mounting direction by the notch structure and the at least one recess;
   wherein the at least one recess comprises a top opening formed on the top wall of the main body and a lateral opening formed on the lateral wall of the main body and communicated with the top opening, the pivoting portion is located inside the at least one recess, and the notch structure is located at a position corresponding to the lateral opening for allowing a disengaging movement of the at least one pivotal structure and the pivoting portion.

2. The flip cover device of claim 1, wherein a resilient abutting portion is formed on an end portion of the at least one pivotal structure, the resilient abutting portion is resiliently deformed during a process that the at least one pivotal structure pivotally passes through the pivoting portion, and the resilient abutting portion resiliently recovers to abut against the pivoting portion after the at least one pivotal structure pivotally passes through the pivoting portion.

3. A hinge disposed between a cover and a main body of a flip cover device, the hinge being disposed on the main body in an inserting manner, the hinge being pivotally connected to the cover in a detachable manner for allowing the cover to pivotally unfold or fold relative to the main body, the cover abutting against the main body when the cover pivotally unfolds relative to the main body to an unfolded position along a first pivoting direction, the at least one hinge being a one-piece structure, a pivotal structure of the cover pivotally passing through the hinge, the hinge comprising:

a hinge body; and a notch structure formed on the hinge body;

wherein the cover is driven by a reaction force provided by the main body to disengage from the hinge via the notch structure when the cover is located at the unfolded position and forced by a torque along the first pivoting direction;

wherein the hinge body further comprises a mounting portion and a pivoting portion connected to the mounting portion, the mounting portion is mounted on the main body, the notch structure is formed on the pivoting portion, and the pivoting portion is for allowing the pivotal structure of the cover to pivotally pass therethrough;

wherein the mounting portion is mounted inside a mounting slot formed on the main body, and the pivoting portion is at least partially exposed through a recess formed on the main body and located at a position corresponding to the mounting slot;

wherein the mounting portion is inserted into the mounting slot via the recess along a mounting direction, and the notch structure is formed on a lateral side of the pivoting portion for allowing the pivotal structure to be disengaged from the pivoting portion along a disengaging direction different from the mounting direction by the notch structure and the recess;

wherein the recess comprises a top opening formed on the top wall of the main body and a lateral opening formed on the lateral wall of the main body and communicated with the top opening, the pivoting portion is located inside the recess, and the notch structure is located at a position corresponding to the lateral opening for allowing a disengaging movement of the pivotal structure and the pivoting portion.

4. The hinge of claim 3, wherein the pivoting portion abuts against a resilient abutting portion formed on an end portion of the pivotal structure after the pivotal structure pivotally passes through the pivoting portion.

* * * * *